US012601050B2

(12) United States Patent
Waldfried et al.

(10) Patent No.: US 12,601,050 B2
(45) Date of Patent: Apr. 14, 2026

(54) SURFACE MODIFIED SUBSTRATES AND RELATED METHODS

(71) Applicant: ENTEGRIS, INC., Billerica, MA (US)

(72) Inventors: Carlo Waldfried, Middleton, MA (US); Surendra Maharjan, Lowell, MA (US); Stephen Longo, Westford, MA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 18/785,339

(22) Filed: Jul. 26, 2024

(65) Prior Publication Data

US 2025/0034700 A1 Jan. 30, 2025

Related U.S. Application Data

(60) Provisional application No. 63/529,324, filed on Jul. 27, 2023.

(51) Int. Cl.
*C23C 16/30* (2006.01)
*C23C 16/52* (2006.01)

(52) U.S. Cl.
CPC .............. *C23C 16/30* (2013.01); *C23C 16/52* (2013.01)

(58) Field of Classification Search
None
See application file for complete search history.

(56) References Cited

U.S. PATENT DOCUMENTS

| | | | |
|---|---|---|---|
| 5,756,222 A | 5/1998 | Bercaw et al. | |
| 5,811,195 A | 9/1998 | Bercaw et al. | |
| 6,215,806 B1 | 4/2001 | Ohmi et al. | |
| 7,393,765 B2 | 7/2008 | Hanawa et al. | |
| 8,293,658 B2 | 10/2012 | Shero et al. | |
| 10,913,202 B2 | 2/2021 | Espalin et al. | |
| 11,318,532 B2 | 5/2022 | Anthony et al. | |
| 11,807,946 B2 | 11/2023 | Biener et al. | |
| 2002/0104590 A1 | 8/2002 | Harenski et al. | |
| 2005/0058848 A1 | 3/2005 | Hodgens et al. | |
| 2006/0170058 A1* | 8/2006 | Chiang | H01L 21/76834 |
| | | | 257/E21.507 |
| 2010/0080903 A1 | 4/2010 | Tamitsuji et al. | |
| 2010/0096044 A1 | 4/2010 | Misawa et al. | |
| 2013/0095380 A1 | 4/2013 | Affinito et al. | |
| 2016/0273095 A1 | 9/2016 | Lin et al. | |
| 2017/0182558 A1 | 6/2017 | Shimizu et al. | |

(Continued)

FOREIGN PATENT DOCUMENTS

| | | |
|---|---|---|
| CN | 103341625 B | 5/2015 |
| CN | 109423641 A | 3/2019 |

(Continued)

OTHER PUBLICATIONS

Machine translation, KR-20160145652-A (Year: 2016).*

(Continued)

*Primary Examiner* — Michael G Miller

(57) ABSTRACT

Surface modified substrates and related methods are provided. A substrate having a modified surface comprises a first region and a second region. The first region is located above the second region. The first region comprises a nickel fluoride. The second region comprises a nickel alloy. A concentration of the nickel fluoride gradually decreases from the first region to the second region.

20 Claims, 3 Drawing Sheets

(56)　　　References Cited

U.S. PATENT DOCUMENTS

| | | | |
|---|---|---|---|
| 2017/0304894 | A1 | 10/2017 | Buller |
| 2017/0370005 | A1 | 12/2017 | Mironets et al. |
| 2018/0068890 | A1 | 3/2018 | Zope et al. |
| 2018/0135157 | A1 | 5/2018 | Jeong et al. |
| 2018/0202047 | A1 | 7/2018 | Lin et al. |
| 2018/0214953 | A1 | 8/2018 | Knittel et al. |
| 2019/0040529 | A1 | 2/2019 | Verbaas et al. |
| 2019/0085478 | A1 | 3/2019 | Burks et al. |
| 2019/0312202 | A1 | 10/2019 | Yokoyama et al. |
| 2020/0079966 | A1 | 3/2020 | Holt et al. |
| 2020/0254547 | A1 | 8/2020 | Puidokas et al. |
| 2020/0324470 | A1 | 10/2020 | Walker |
| 2020/0397542 | A1 | 12/2020 | Andersen et al. |
| 2021/0198788 | A1 | 7/2021 | Waldfried et al. |
| 2022/0181124 | A1 | 6/2022 | Duan et al. |
| 2022/0251699 | A1 * | 8/2022 | Miyaishi ................. C23C 28/32 |
| 2023/0093910 | A1 | 3/2023 | Waldfried |
| 2024/0401197 | A1 | 12/2024 | Wu et al. |

FOREIGN PATENT DOCUMENTS

| | | | | |
|---|---|---|---|---|
| CN | 110352106 | A | | 10/2019 |
| CN | 109112595 | A | | 6/2020 |
| CN | 109940163 | B | | 12/2020 |
| CN | 112675362 | A | | 4/2021 |
| CN | 220069926 | U | | 11/2023 |
| EP | 460700 | A | | 12/1991 |
| JP | S57117992 | A | | 7/1982 |
| JP | H0466657 | A | | 3/1992 |
| JP | H04120728 | A | | 4/1992 |
| JP | H09298329 | A | | 11/1997 |
| JP | 2986859 | B2 | | 12/1999 |
| JP | 2003119540 | A | | 4/2003 |
| JP | 2010037581 | A | | 2/2010 |
| JP | 2019218620 | A | | 12/2019 |
| KR | 20160145652 | A | * | 12/2016 ............ C23C 28/00 |
| KR | 20230007495 | A | | 1/2023 |
| TW | 202318535 | A | | 5/2023 |
| WO | 2008041701 | A1 | | 4/2008 |
| WO | 2019194869 | A2 | | 10/2019 |
| WO | 202014287 | W | | 1/2020 |
| WO | 2020257488 | A1 | | 12/2020 |
| WO | 2023079831 | A1 | | 5/2023 |

OTHER PUBLICATIONS

Li Bo, 3D Printing Technology, China Light Industry Press (Chinese only), pp. 1-2, 2017.

Dong et al., Extrusion-based 3D printed magnesium scaffolds with multifunctional $MgF_2$ and $MgF_2$—CaP coatings, The Royal Society of Chemistry, Biomaterial Science, vol. 9, pp. 7159-7182, 2021.

Lea, C. et al., Magnesium diffusion, surface segregation and oxidation in Al—Mg alloys, Chapman and Hall Ltd., 1984.

* cited by examiner

SURFACE MODIFIED SUBSTRATES AND RELATED METHODS

CROSS-REFERENCE TO RELATED APPLICATIONS

This application claims the benefit under 35 USC 119 of U.S. Provisional Patent Application No. 63/529,324 filed on Jul. 27, 2023, the disclosure of which is hereby incorporated herein by reference in its entirety.

FIELD

The present disclosure relates to surface modified substrates and related methods.

BACKGROUND

Semiconductor and microelectronic device manufacturing methods require processing steps that use reactive process materials, such as plasma, in surface treatments. Manufacturing substrates with a protective coating to provide chemical, physical, and/or electrical resistance to these surface treatments remains an ongoing challenge.

SUMMARY

Some embodiments relate to a substrate. In some embodiments, the substrate comprises a first region comprising a nickel fluoride. In some embodiments, the substrate comprises a second region comprising a nickel alloy. In some embodiments, the first region is above the second region. In some embodiments, a concentration of the nickel fluoride decreases from the first region to the second region.

Some embodiments relate to a method. In some embodiments, the method comprises exposing a substrate to a fluorine-containing vapor sufficient to form at least one of a first region comprising a nickel fluoride, a second region comprising a nickel alloy, or any combination thereof. In some embodiments, the first region is above the second region. In some embodiments, a concentration of the nickel fluoride decreases from the first region to the second region.

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
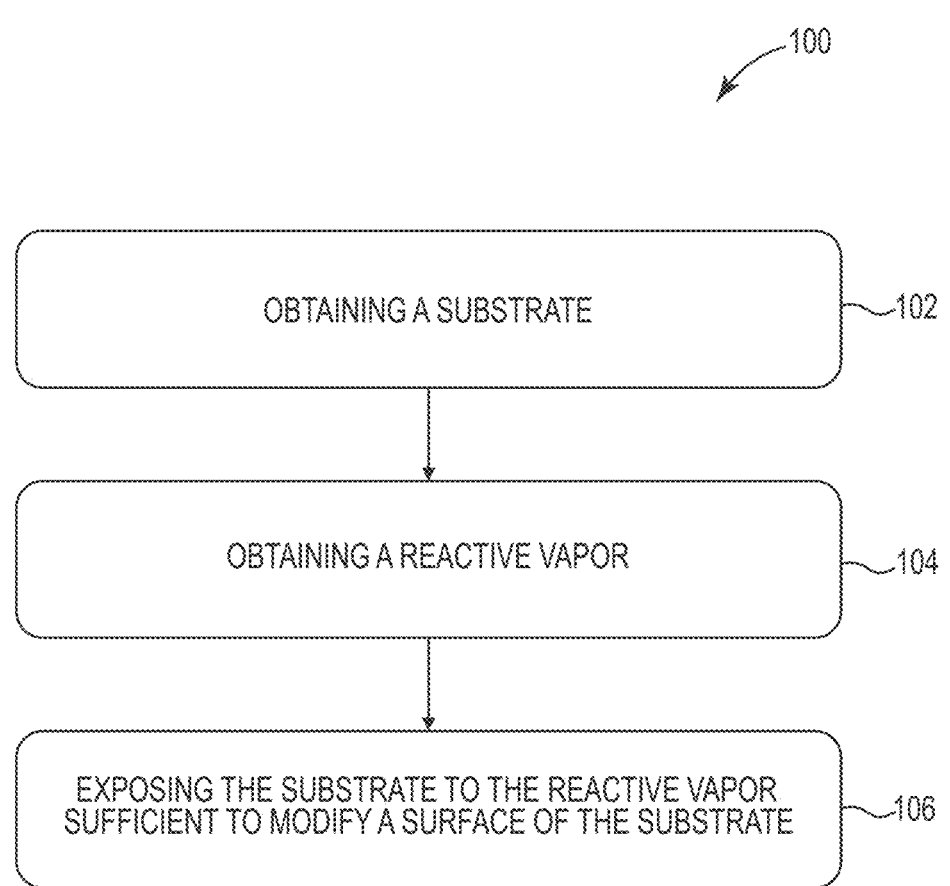
FIG. 1 is a flowchart of a method for modifying a surface of a substrate, according to some embodiments.

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though they may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Conventional coatings can be applied to the surfaces of substrates useful in microelectronic fabrication (e.g., semiconductor fabrication) to protect against chemical resistance, physical resistance, and electrical resistance. Due to limitations with respect to the conventional coatings and processes for forming the conventional coatings, the resulting coated substrates have numerous disadvantages. Conventional coatings are non-uniform in thickness and non-conformal with the underlying surface. In addition, these problems are exacerbated by substrates with high-aspect ratio features (e.g., deep trenches, etc.). Forming a conformal and uniform coating on high-aspect ratio substrates remains an ongoing challenge.

Some embodiments disclosed herein overcome all or at least some of the challenges of conventional coatings by providing surface modified substrates and processes for modifying surfaces of substrates. In some embodiments, for example, the surface of the substrate is exposed to a vapor that reacts with metals present in the substrate, thereby resulting in a modified surface that exhibits improved chemical resistance, physical resistance, and/or electrical resistance, among other things. These modified surfaces can protect the substrate, without a coating or other material being deposited on the surface of the substrate. Using a reactive vapor to modify the surface of the substrate provides access to uniform and conformal surface modifications on high-aspect ratio substrates, with difficult to access features, because the reactive vapor is readily and easily exposed to all surfaces of high-aspect ratio substrates.

FIG. 1 is a flowchart of a method 100 for modifying a surface of a substrate, according to some embodiments. As shown in FIG. 1, the method comprises one or more of the following steps: obtaining 102 a substrate; obtaining 104 a reactive vapor; and exposing 106 the substrate to the reactive vapor sufficient to modify a surface of the substrate.

At step 102, the substrate is obtained. The substrate can comprise a substrate useful in microelectronic fabrication, such as, for example and without limitation, semiconductor fabrication. The substrate can be a high-aspect ratio substrate, such as, for example and without limitation, a substrate having an aspect ratio of 2:1 or 20:1 to 2000:1. The aspect ratio of the substrate can refer to a ratio of two of a width, a depth, a height, a length, or a diameter, in any combination. In some embodiments, for example, the aspect ratio refers to the ratio of a depth of a circular hole (e.g., a pore, etc.) to a diameter of the circular hole (e.g., the pore, etc.). In some embodiments, the aspect ratio refers to the ratio of a depth of a non-circular hole (e.g., a trench, etc.) to a width of the non-circular hole (e.g., the trench, etc.). Non-limiting examples of substrates, including high-aspect ratio substrates, include, without limitation, at least one of a membrane, a showerhead, a liner, a tube, a gas line, a valve, an injector, a tray, or any combination thereof.

The substrate may have an aspect ratio of 20:1 to 2000:1, or any range or subrange between 20:1 and 2000:1. In some embodiments, the substrate may have an aspect ratio of 50:1 to 2000:1, 100:1 to 2000:1, 200:1 to 2000:1, 300:1 to 2000:1, 400:1 to 2000:1, 500:1 to 2000:1, 600:1 to 2000:1, 700:1 to 2000:1, 800:1 to 2000:1, 900:1 to 2000:1, 1000:1 to 2000:1, 1100:1 to 2000:1, 1200:1 to 2000:1, 1300:1 to 2000:1, 1400:1 to 2000:1, 1500:1 to 2000:1, 1600:1 to 2000:1, 1700:1 to 2000:1, 1800:1 to 2000:1, 1900:1 to 2000:1, 20:1 to 1900:1, 20:1 to 1800:1, 20:1 to 1700:1, 20:1 to 1600:1, 20:1 to 1500:1, 20:1 to 1400:1, 20:1 to 1300:1, 20:1 to 1200:1, 20:1 to 1100:1, 20:1 to 1000:1, 20:1 to 900:1, 20:1 to 800:1, 20:1 to 700:1, 20:1 to 600:1, 20:1 to 500:1, 20:1 to 400:1, 20:1 to 300:1, 20:1 to 200:1, 20:1 to 100:1, or 20:1 to 50:1.

In some embodiments, the substrate comprises a nickel (Ni) component. In some embodiments, the nickel component comprises elemental nickel (e.g., nickel metal). In some embodiments, the nickel component comprises a molecular nickel (e.g., nickel is a part of a molecule). In some embodiments, the nickel component comprises a nickel cation (e.g., $Ni^+$, $Ni^{+2}$, $Ni^{+3}$, $Ni^{+4}$, etc.). In some embodiments, the nickel component comprises a nickel alloy. In some embodiments, the nickel alloy comprises at least one of a copper component, an iron component, a manganese component, a silicon component, a zinc component, a magnesium component, a chromium component, a titanium component, or any combination thereof. In some embodiments, reference to a metal component refers to at least one of an elemental form of the metal, a molecular form of the metal, an ionic form of the metal, or any combination thereof.

In some embodiments, the substrate comprises at least 50% to 99% by weight of the nickel component based on a total weight of the substrate, or any range or subrange between 50% and 99% by weight of the nickel component based on the total weight of the substrate. In some embodiments, the substrate comprises 50% to 95%, 50% to 90%, 50% to 85%, 50% to 80%, 50% to 75%, 50% to 70%, 50% to 65%, 50% to 60%, 50% to 55%, 55% to 99%, 60% to 99%, 65% to 99%, 70% to 99%, 75% to 99%, 80% to 99%, 85% to 99%, 90% to 99%, or 95% to 99%. In some embodiments, the substrate is entirely nickel and comprises 100% by weight of the nickel component based on the total weight of the substrate. In some embodiments, the substrate comprises less than 10% by weight of the iron component based on the total weight of the substrate. For example, in some embodiments, the substrate comprises 0.01% to 10%, 0.01% to 9%, 0.01% to 8%, 0.01% to 7%, 0.01% to 6%, 0.01% to 5%, 0.01% to 4%, 0.01% to 3%, 0.01% to 2%, 0.01% to 1%, 0.01% to 0.1%, 0.1% to 10%, 1% to 10%, 2% to 10%, 3% to 10%, 4% to 10%, 5% to 10%, 6% to 10%, 7% to 10%, 8% to 10%, or 9% to 10% by weight of the iron component based on the total weight of the substrate.

At step 104, the reactive vapor is obtained. In some embodiments, the reactive vapor comprises a fluorine component. In some embodiments, the reactive vapor comprises a fluorine-containing vapor. In some embodiments, the fluorine-containing vapor comprises a fluorine component that reacts or is reactive with the nickel component of the substrate.

In some embodiments, the fluorine component comprises a molecular fluorine source vapor, which may be derived from a liquid or solid. In some embodiments, the fluorine component comprises molecular fluorine. In some embodiments, the fluorine component is not ionic, substantially not ionic, not processed (e.g., by adding energy other than heat) to form plasma, or any combination thereof. In some embodiments, the fluorine component comprises at least one of a fluorinated organic compound, a perfluorinated organic compound, or any combination thereof. In some embodiments, for example, the fluorine component comprises at least one of a fluorinated alkane, a perfluorinated alkane, a fluorinated alkene, a perfluorinated alkene, or any combination thereof, wherein any one or more of which may be linear or branched. In some embodiments, the fluorine-containing vapor comprises at least one of $CF_4$, $C_2F_4$, $C_3F_6$, $C_4F_8$, $CHF_3$, $C_2H_2F_2$, $C_2F_6$, HF, $CH_3F$, or any combination thereof.

In some embodiments, the fluorine component comprises a vaporized fluorinated polymer. In some embodiments, for example, obtaining the reactive vapor comprises heating a fluorinated polymer to a temperature sufficient to vaporize at least a portion of the fluorinated polymer. In some embodiments, the fluorine component comprises a gaseous fluorinated polymer derived from a non-gaseous fluorinated polymer (e.g., a solid or a liquid phase fluorinated polymer). In some embodiments, the fluorinated polymer comprises a homopolymer or a copolymer. In some embodiments, the fluorinated polymer comprises a copolymer of at least one fluoroolefin monomer and optionally at least one non-fluorinated co-monomer. In some embodiments, the fluorinated polymer may be fluorinated (i.e., partially fluorinated), perfluorinated, or may include non-fluorine halogen atoms, such as, for example and without limitation, chlorine. In some embodiments, a molecular fluorine source may be liquid or solid at room temperature, but that vaporizes at the process temperatures disclosed herein. Non-limiting examples of fluoropolymers include, without limitation, at least one of the following: polymerized perfluoroalkylethylene having a $C_1$-$C_{10}$ perfluoroalkyl group, polytetrafluoroethylene (PTFE), tetrafluoroethylene/perfluoro(alkyl vinyl ether) copolymer (PFA), tetrafluoroethylene/hexafluoropropylene copolymer (FEP), tetrafluoroethylene/perfluoro(alkyl alkenyl ether)/hexafluoropropylene copolymer (EPA), polyhexafluoropropylene, ethylene/tetrafluoroethylene copolymer (ETFE), poly trifluoroethylene, polyvinylidene fluoride (PVDF), polyvinyl fluoride (PVF), polychlorotrifluoroethylene (PCTFE), ethylene/chlorotrifluoroethylene copolymer (ECTFE), or any combination thereof.

At step 106, the substrate is exposed to the reactive vapor sufficient to modify a surface of the substrate. In some embodiments, the exposing comprises flowing the reactive vapor into a chamber containing the substrate. In some embodiments, the exposing comprises contacting the reactive vapor with at least one surface of the substrate. In some embodiments, the exposing comprises pumping the reactive vapor into a chamber containing the substrate. In some embodiments, the exposing comprises discharging the reactive vapor into a chamber containing the substrate. In some embodiments, the exposing comprises introducing the reactive vapor into a chamber containing the substrate. In some embodiments, the exposing comprises feeding the reactive vapor into a chamber containing the substrate.

In some embodiments, the exposing proceeds under conditions sufficient to modify a surface of the substrate. For example, the conditions of the exposing may comprise at least one of a temperature of 200° C. to 600° C., a pressure of 760 Torr (e.g., atmospheric pressure), a duration of 1 millisecond to 15 hours, or any combination thereof. In some embodiments, the exposing proceeds at or to a temperature of 250° C. to 600° C., 300° C. to 600° C., 350° C. to 600° C., 400° C. to 600° C., 450° C. to 600° C., 500° C. to 600° C., 550° C. to 600° C., 200° C. to 550° C., 200° C. to 500° C., 200° C. to 450° C., 200° C. to 400° C., 200° C. to 350° C., 200° C. to 300° C., or 200° C. to 250° C., or any range or subrange between 200° C. and 600° C. In some embodiments, the exposing comprises heating the substrate at or to one or more of the aforementioned temperatures between 200° C. and 600° C., or any range or subrange between 200° C. and 600° C.

In some embodiments, the exposing proceeds at a pressure in a range of 100 Torr to 1000 Torr, or any range or subrange between 100 Torr and 1000 Torr. In some embodiments, for example, the exposing proceeds at a pressure of 100 Torr to 900 Torr, 100 Torr to 850 Torr, 100 Torr to 800 Torr, 100 Torr to 750 Torr, 100 Torr to 700 Torr, 100 Torr to 650 Torr, 100 Torr to 600 Torr, 100 Torr to 550 Torr, 100 Torr to 500 Torr, 100 Torr to 450 Torr, 100 Torr to 400 Torr, 100 Torr to 350 Torr, 100 Torr to 300 Torr, 100 Torr to 250 Torr, 100 Torr to 200 Torr, 100 Torr to 150 Torr, 150 Torr to 1000 Torr, 200 Torr to 1000 Torr, 250 Torr to 1000 Torr, 300 Torr to 1000 Torr, 350 Torr to 1000 Torr, 400 Torr to 1000 Torr, 450 Torr to 1000 Torr, 500 Torr to 1000 Torr, 550 Torr to 1000 Torr, 600 Torr to 1000 Torr, 650 Torr to 1000 Torr, 700 Torr to 1000 Torr, 750 Torr to 1000 Torr, 800 Torr to 1000 Torr, 850 Torr to 1000 Torr, 900 Torr to 1000 Torr, or 950 Torr to 1000 Torr. In some embodiments, the exposing proceeds at atmospheric pressure.

In some embodiments, the exposing proceeds for a duration of 1 millisecond to 14 hours, 1 millisecond to 13 hours, 1 millisecond to 12 hours, 1 millisecond to 11 hours, 1 millisecond to 10 hours, 1 millisecond to 9 hours, 1 millisecond to 8 hours, 1 millisecond to 7 hours, 1 millisecond to 6 hours, 1 millisecond to 5 hours, 1 millisecond to 4 hours, 1 millisecond to 3 hours, 1 millisecond to 2 hours, 1 millisecond to 1 hour, 1 millisecond to 30 minutes, 1 millisecond to 15 minutes, 1 millisecond to 1 minute, 1 millisecond to 30 seconds, 1 millisecond to 1 second, 1 hour to 15 hours, 2 hours to 15 hours, 3 hours to 15 hours, 4 hours to 15 hours, hours to 15 hours, 5 hours to 15 hours, 6 hours to 15 hours, 7 hours to 15 hours, hours to 15 hours, 8 hours to 15 hours, 9 hours to 15 hours, 10 hours to 15 hours, 11 hours to 15 hours, 12 hours to 15 hours, 13 hours to 15 hours, 14 hours to 15 hours, or any range or subrange between 1 millisecond and 15 hours.

In some embodiments, the exposing is sufficient to modify at least one surface of the substrate so as to form at least one of a first region, a second region, or any combination thereof. In some embodiments, the exposing is sufficient to modify at least one surface of the substrate so as to form a first region and a second region, wherein the first region is above the second region. Wherein in this application above can mean outermost layer of a 3 dimensional structure and can be outside of the inner layer.

In some embodiments, the first region is an outermost region of the substrate relative to the second region. In some embodiments, the first region is the region comprising the modified surface(s) of the substrate. In some embodiments, a surface is modified when at least a portion of the surface or components thereof react with the reactive vapor, for example, to chemically change the substrate, wherein the chemically changed portion of the substrate is or comprises the first region. In some embodiments, the first region comprises all vapor-exposed and/or gas-exposed surfaces of the substrate. For example, in some embodiments, the first region comprises all surfaces in direct contact with, or in fluid communication with, the reactive vapor. In some embodiments, the first region extends from a surface of the substrate to a first depth beneath the surface of the substrate.

In some embodiments, the second region is a region that does not include any surface of the substrate. In some embodiments, the second region is a region of the substrate that has not reacted with the reactive vapor. In some embodiments, the second region is the region of the substrate that has reacted less with the reactive vapor than the first region. In some embodiments, the second region extends from about the first region to a second depth, wherein the second depth is greater than the first depth. In some embodiments, the substrate does not comprise the second region (e.g., when the substrate is exposed for a sufficient duration so as to chemically change the entire substrate). In some embodiments, the first region comprises a nickel fluoride ($NiF_2$). In some embodiments, the second region comprises a nickel alloy. In some embodiments, the first region comprises a nickel fluoride and the second region comprises a nickel alloy, wherein a concentration of the nickel fluoride gradually decreases from the first region to the second region. In some embodiments, the fluorine component from the fluorine-containing vapor reacts with the nickel component of the substrate to form the first region.

In some embodiments, the modified surface is present on all exposed surfaces of the substrate, including features that have a high aspect ratio (e.g., holes, channels, internal plenums, metal membranes). In some embodiments, the modified surface is a corrosion-resistant surface that protects against corrosion. In some embodiments, the modified surface is a passivated surface of the substrate.

In some embodiments, at least a portion of the first region has a depth of 1 nm to 50 μm, or any range or subrange therebetween. For example, in some embodiments, at least a portion of the first region has a depth of less than 5 μm, less than 1 μm, or less than 250 nm. In some embodiments, at least a portion of the first region has a depth of 100 nm to 250 nm, 1 nm to 4 μm, 1 nm to 3 μm, 1 nm to 2 μm, 1 nm to 1 μm, 1 nm to 900 nm, 1 nm to 850 nm, 1 nm to 800 nm, 1 nm to 750 nm, 1 nm to 700 nm, 1 nm to 650 nm, 1 nm to 600 nm, 1 nm to 550 nm, 1 nm to 450 nm, 1 nm to 400 nm, 1 nm to 350 nm, 1 nm to 300 nm, 1 nm to 250 nm, 1 nm to 200 nm, 1 nm to 150 nm, 1 nm to 100 nm, 1 nm to 50 nm, 50 nm to 5 μm, 100 nm to 5 μm, 200 nm to 5 μm, 300 nm to 5 μm, 400 nm to 5 μm, 500 nm to 5 μm, 600 nm to 5 μm, 700 nm to 5 μm, 800 nm to 5 μm, 900 nm to 5 μm, 1 μm to 5 μm, 2 μm to 5 μm, 3 μm to 5 μm, 4 μm to 5 μm, 1 nm to 750 nm, 1 nm to 500 nm, 2 nm to 500 nm, 1 nm to 250 nm, 20 nm to 125 nm, 20 nm to 250 nm, 20 nm to 500 nm, 50 nm to 500 nm, 50 nm to 400 nm, 50 nm to 300 nm, 50 nm to 200 nm, 15 nm to 200 nm, 20 nm to 50 nm, 10 nm to 40 nm, 30 nm to 50 nm, 1 nm to 5 μm, 1 μm to 5 μm, 1 μm to 4 μm, 1 μm to 3 μm, 1 μm to 2 μm, 5 nm to 5 μm, 1 nm to 1 μm, or 10 nm to 5 μm.

In some embodiments, at least a portion of the second region has a depth of 1 nm to 50 μm, or any range or subrange therebetween. For example, in some embodiments, at least a portion of the second region has a depth of less than 5 μm, less than 1 μm, or less than 250 nm. In some embodiments, at least a portion of the second region has a depth of 100 nm to 250 nm, 1 nm to 4 μm, 1 nm to 3 μm, 1 nm to 2 μm, 1 nm to 1 μm, 1 nm to 900 nm, 1 nm to 850 nm, 1 nm to 800 nm, 1 nm to 750 nm, 1 nm to 700 nm, 1 nm to 650 nm, 1 nm to 600 nm, 1 nm to 550 nm, 1 nm to 450 nm, 1 nm to 400 nm, 1 nm to 350 nm, 1 nm to 300 nm, 1 nm to 250 nm, 1 nm to 200 nm, 1 nm to 150 nm, 1 nm to 100 nm, 1 nm to 50 nm, 50 nm to 5 μm, 100 nm to 5 μm, 200 nm to 5 μm, 300 nm to 5 μm, 400 nm to 5 μm, 500 nm to 5 μm, 600 nm to 5 μm, 700 nm to 5 μm, 800 nm to 5 μm, 900 nm to 5 μm, 1 μm to 5 μm, 2 μm to 5 μm, 3 μm to 5 μm, 4 μm to 5 μm, 1 nm to 750 nm, 1 nm to 500 nm, 2 nm to 500 nm, 1 nm to 250 nm, 20 nm to 125 nm, 20 nm to 250 nm, 20 nm to 500 nm, 50 nm to 500 nm, 50 nm to 400 nm, 50 nm to 300 nm, 50 nm to 200 nm, 15 nm to 200 nm, 20 nm to 50 nm, 10 nm to 40 nm, 30 nm to 50 nm, 1 nm to 5 μm, 1 μm to 5 μm, 1 μm to 4 μm, 1 μm to 3 μm, 1 μm to 2 μm, 5 nm to 5 μm, 1 nm to 1 μm, or 10 nm to 5 μm.

In some embodiments, at least a portion of the third region has a depth of 1 nm to 50 μm, or any range or subrange therebetween. For example, in some embodiments, at least a portion of the third region has a depth of less than 5 μm, less than 1 μm, or less than 250 nm. In some embodiments, at least a portion of the third region has a depth of 100 nm to 250 nm, 1 nm to 4 μm, 1 nm to 3 μm, 1 nm to 2 μm, 1 nm to 1 μm, 1 nm to 900 nm, 1 nm to 850 nm, 1 nm to 800 nm, 1 nm to 750 nm, 1 nm to 700 nm, 1 nm to 650 nm, 1 nm to 600 nm, 1 nm to 550 nm, 1 nm to 450 nm, 1 nm to 400 nm, 1 nm to 350 nm, 1 nm to 300 nm, 1 nm to 250 nm, 1 nm to 200 nm, 1 nm to 150 nm, 1 nm to 100 nm, 1 nm to 50 nm, 50 nm to 5 μm, 100 nm to 5 μm, 200 nm to 5 μm, 300 nm to 5 μm, 400 nm to 5 μm, 500 nm to 5 μm, 600 nm to 5 μm, 700 nm to 5 μm, 800 nm to 5 μm, 900 nm to 5 μm, 1 μm to 5 μm, 2 μm to 5 μm, 3 μm to 5 μm, 4 μm to 5 μm, 1 nm to 750 nm, 1 nm to 500 nm, 2 nm to 500 nm, 1 nm to 250 nm, 20 nm to 125 nm, 20 nm to 250 nm, 20 nm to 500 nm, 50 nm to 500 nm, 50 nm to 400 nm, 50 nm to 300 nm, 50 nm to 200 nm, 15 nm to 200 nm, 20 nm to 50 nm, 10 nm to 40 nm, 30 nm to 50 nm, 1 nm to 5 μm, 1 μm to 5 μm, 1 μm to 4 μm, 1 μm to 3 μm, 1 μm to 2 μm, 5 nm to 5 μm, 1 nm to 1 μm, or 10 nm to 5 μm.

In some embodiments, the modified surface of the substrate is formed by a vapor deposition process. Examples of vapor deposition processes include, without limitation, at least one of a chemical vapor deposition (CVD) process, a digital or pulsed chemical vapor deposition process, a plasma-enhanced cyclical chemical vapor deposition process (PECCVD), a flowable chemical vapor deposition process (FCVD), an atomic layer deposition (ALD) process, a thermal atomic layer deposition, a plasma-enhanced atomic layer deposition (PEALD) process, a metal organic chemical vapor deposition (MOCVD) process, a plasma-enhanced chemical vapor deposition (PECVD) process, or any combination thereof.

In some embodiments, the substrate has a nickel fluoride content of 60% to 80% as measured by XPS, or any range or subrange between 60% and 80%. For example, in some embodiments, the fluoride content of the substrate may be 61% to 80%, 62% to 80%, 63% to 80%, 64% to 80%, 65% to 80%, 66% to 80%, 67% to 80%, 68% to 80%, 69% to 80%, 70% to 80%, 71% to 80%, 72% to 80%, 73% to 80%, 74% to 80%, 75% to 80%, 76% to 80%, 77% to 80%, 78% to 80%, or 79% to 80%. In some embodiments, the fluoride content of the substrate may be 60% to 79%, 60% to 78%, 60% to 77%, 60% to 76%, 60% to 75%, 60% to 74%, 60% to 73%, 60% to 72%, 60% to 71%, 60% to 70%, 60% to 69%, 60% to 68%, 60% to 67%, 60% to 66%, 60% to 65%, 60% to 64%, 60% to 63%, 60% to 62%, or 60% to 61%. In some embodiments, the nickel fluoride content is the content of nickel fluoride in the first region.

Figure 2:
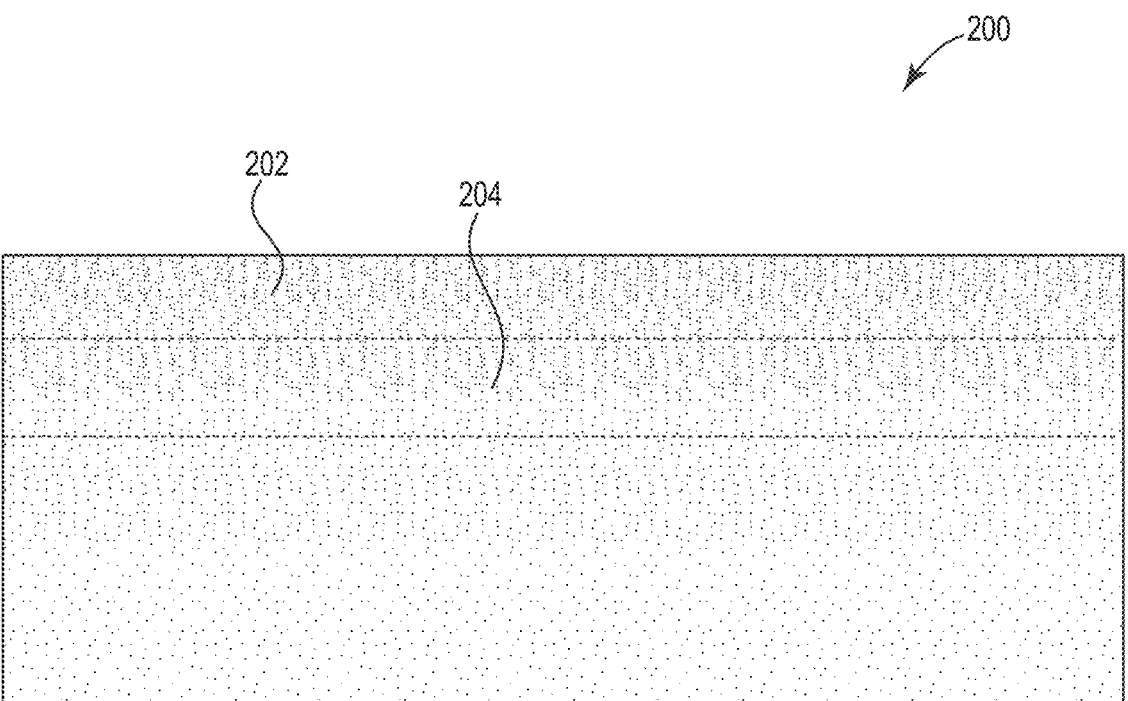
FIG. 2 is a schematic diagram of at least a portion of a cross-section of a substrate having a modified surface, according to some embodiments.

FIG. 2 is a schematic diagram of at least a portion of a cross-section of a substrate 200 having a modified surface, according to some embodiments. For example, in some embodiments, the substrate 200 has a first surface and a second surface opposite the first surface, wherein only the first surface of the substrate 200 is shown. As shown in FIG. 2, in some embodiments, the substrate 200 comprises a first region 202 and a second region 204. In some embodiments, the first region 202 is above the second region 204. In some embodiments, the first region 202 comprises nickel fluoride (NiF$_2$). In some embodiments, the second region 204 comprises nickel alloy. In some embodiments, the substrate 200 does not comprise magnesium. In some embodiments, the substrate is formed according to the methods disclosed herein. Any of the substrates, first regions, second regions, and other aspects disclosed herein may be used here, without departing from the scope of this disclosure.

Figure 3:
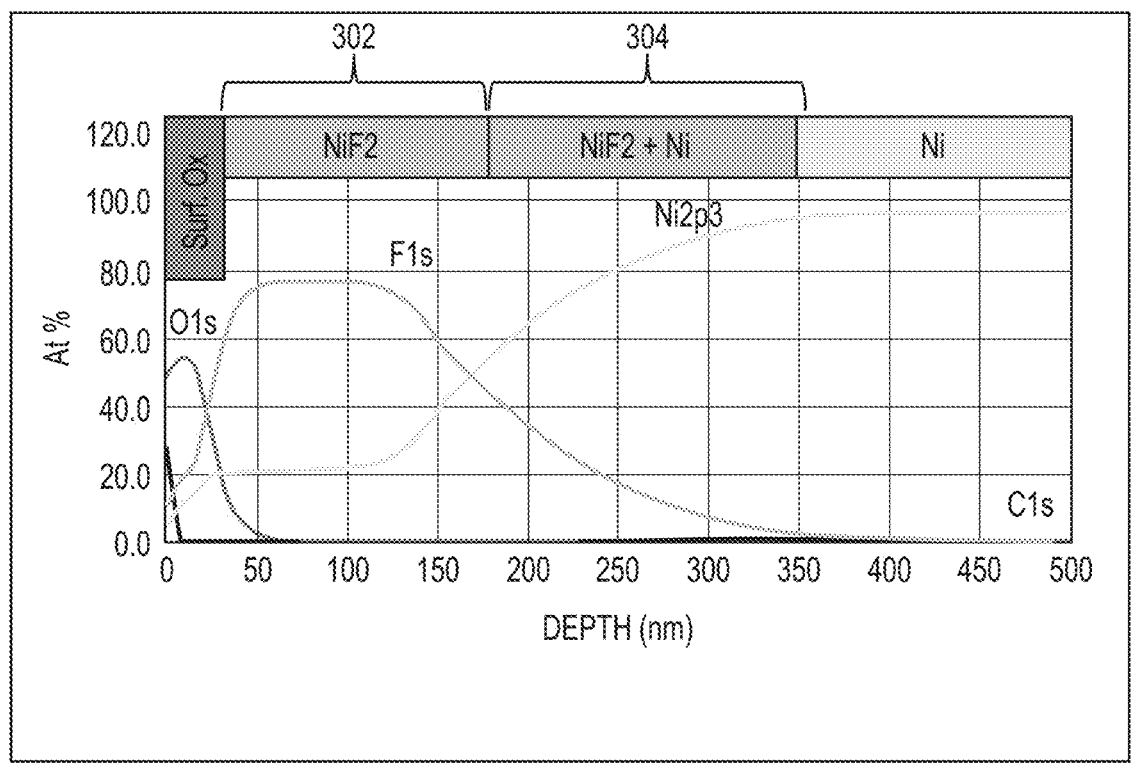
FIG. 3 depicts a depth profile of a substrate having a modified surface, according to some embodiments.

FIG. 3 depicts a depth profile of a substrate having a modified surface, according to some embodiments. As shown in FIG. 3, the first region 302 of the substrate comprises nickel fluoride (NiF$_2$), and the second region 304 of the substrate comprises a mixture of nickel fluoride and nickel alloy, wherein the first region 302 is located above the second region 304. The nickel fluoride content is at least 50% down to a depth of approximately 175 nm (first region 302). The nickel fluoride content is at least 50% down to a depth of approximately 250 nm (second region 304). The nickel content is at least 50% starting at a depth of about 175 nm or greater.

Aspects

Various Aspects are described below. It is to be understood that any one or more of the features recited in the following Aspect(s) can be combined with any one or more other Aspect(s).

Aspect 1. A substrate comprising:
  a first region comprising a nickel fluoride; and
  a second region comprising a nickel alloy,
    wherein the first region is above the second region;
    wherein a concentration of the nickel fluoride decreases from the first region to the second region.

Aspect 2. The substrate according to Aspect 1, wherein the substrate has an aspect ratio of 20:1 to 2000:1, wherein the aspect ratio is a ratio of two of a width, a depth, a height, a length, or a diameter.

Aspect 3. The substrate according to any one of Aspects 1-2, wherein the substrate comprises:
  at least 50% by weight of nickel based on a total weight of the substrate.

Aspect 4. The substrate according to any one of Aspects 1-3, wherein the substrate comprises:
  less than 10% by weight of iron based on the total weight of the substrate.

Aspect 5. The substrate according to any one of Aspects 1-4, wherein the substrate does not comprise magnesium or less than 1% of magnesium.

Aspect 6. The substrate according to any one of Aspects 1-5, wherein the first region extends from a surface of the substrate to a depth of 2 nm to 5 μm.

Aspect 7. The substrate according to any one of Aspects 1-6, wherein the first region has a fluorine content of up to 100% as measured by XPS.

Aspect 8. The substrate according to any one of Aspects 1-7, wherein the first region has a fluorine content of 10% to 70% as measured by XPS.

Aspect 9. The substrate according to any one of Aspects 1-8, wherein the first region is resistant to thermal degradation at temperature of 200° C. to 500° C.

Aspect 10. The substrate according to any one of Aspects 1-9, wherein the first region is an outermost region of the substrate.

Aspect 11. A method comprising:

exposing a substrate to a fluorine-containing vapor sufficient to form at least one of:

a first region comprising a nickel fluoride; and a second region comprising a nickel alloy;

wherein the first region is above the second region;

wherein a concentration of the nickel fluoride decreases from the first region to the second region.

Aspect 12. The method according to Aspect 11, wherein the substrate has an aspect ratio of 20:1 to 2000:1, wherein the aspect ratio is a ratio of two of a width, a depth, a height, a length, or a diameter.

Aspect 13. The method according to any one of Aspects 11-12, wherein the substrate comprises:

at least 50% by weight of nickel based on a total weight of the substrate; and less than 10% by weight of iron based on the total weight of the substrate.

Aspect 14. The method according to any one of Aspects 11-13, wherein a fluorine component from the fluorine-containing vapor reacts with a nickel component of the substrate to form the first region.

Aspect 15. The method according to any one of Aspects 11-14, wherein the fluorine-containing vapor comprises at least one of $CF_4$, $C_2F_4$, $C_3F_6$, $C_4F_8$, $CHF_3$, $C_2H_2F_2$, $C_2F_6$, HF, $CH_3F$, or any combination thereof.

Aspect 16. The method according to any one of Aspects 11-15, wherein the fluorine-containing vapor comprises a vaporized fluorinated polymer.

Aspect 17. The method according to Aspect 16, wherein the vaporized fluorinated polymer is derived from at least one of polymerized perfluoroalkylethylene having a $C_1$-$C_{10}$ perfluoroalkyl group, polytetrafluoroethylene (PTFE), tetrafluoroethylene/perfluoro (alkyl vinyl ether) copolymer (PFA), tetrafluoroethylene/hexafluoropropylene copolymer (FEP), tetrafluoroethylene/perfluoro (alkyl vinyl ether)/hexafluoropropylene copolymer (EPA), polyhexafluoropropylene, ethylene/tetrafluoroethylene copolymer (ETFE), poly trifluoroethylene, polyvinylidene fluoride (PVDF), polyvinyl fluoride (PVF), polychlorotrifluoroethylene (PCTFE), ethylene/chlorotrifluoroethylene copolymer (ECTFE), or any combination thereof.

Aspect 18. The method according to any one of Aspects 11-17, wherein the exposing comprises heating at least a portion of the substrate at or to a temperature of 200° C. to 600° C.

Aspect 19. The method according to any one of Aspects 11-18, wherein the exposing comprises exposing the substrate to the fluorine-containing vapor for a duration of 1 millisecond to 15 hours.

Aspect 20. The method according to any one of Aspects 11-19, wherein the exposing comprises exposing the substrate to the fluorine-containing vapor at about atmospheric pressure.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A substrate comprising:

a modified surface having a first region comprising a nickel fluoride and a second region comprising a nickel alloy, wherein the first region is above the second region and wherein a concentration of the nickel fluoride decreases from the first region to the second region within the modified surface of the substrate.

2. The substrate of claim 1, wherein the substrate has an aspect ratio of 2:1 to 2000:1, wherein the aspect ratio is a ratio of two of a width, a depth, a height, a length, or a diameter.

3. The substrate of claim 1, wherein the substrate comprises:

at least 50% by weight of nickel based on a total weight of the substrate.

4. The substrate of claim 1, wherein the substrate comprises:

less than 10% by weight of iron based on a total weight of the substrate.

5. The substrate of claim 1 wherein the substrate does not comprise magnesium.

6. The substrate of claim 1, wherein the first region extends from a surface of the substrate to a depth of 2 nm to 5 μm.

7. The substrate of claim 1, wherein the first region has a fluorine content of up to 100% as measured by XPS.

8. The substrate of claim 1, wherein the first region has a fluorine content of 10% to 70% as measured by XPS.

9. The substrate of claim 1, wherein the first region is resistant to thermal degradation at temperature of 200° C. to 500° C.

10. The substrate of claim 1, wherein the first region is an outermost region of the substrate.

11. A method comprising:

exposing a substrate to a fluorine-containing vapor sufficient to chemically modify a surface of the substrate to form a modified surface having a first region comprising a nickel fluoride and a second region comprising a nickel alloy, wherein the first region is above the second region and wherein a concentration of the nickel fluoride decreases from the first region to the second region within the substrate.

12. The method of claim 11, wherein the substrate has an aspect ratio of 2:1 to 2000:1, wherein the aspect ratio is a ratio of two of a width, a depth, a height, a length, or a diameter.

13. The method of claim 11, wherein the substrate comprises:

at least 50% by weight of nickel based on a total weight of the substrate; and less than 10% by weight of iron based on the total weight of the substrate.

14. The method of claim 11, wherein a fluorine component from the fluorine-containing vapor reacts with a nickel component of the substrate to form the first region.

15. The method of claim 11, wherein the fluorine-containing vapor comprises at least one of $CF_4$, $C_2F_4$, $C_3F_6$, $C_4F_8$, $CHF_3$, $C_2H_2F_2$, $C_2F_6$, HF, $CH_3F$, or any combination thereof.

16. The method of claim 11, wherein the fluorine-containing vapor comprises a vaporized fluorinated polymer.

17. The method of claim 16, wherein the vaporized fluorinated polymer is derived from at least one of polymerized perfluoroalkylethylene having a $C_1$-$C_{10}$ perfluoroalkyl group, polytetrafluoroethylene (PTFE), tetrafluoroethylene/perfluoro(alkyl vinyl ether) copolymer (PFA), tetrafluoroethylene/hexafluoropropylene copolymer (FEP), tetrafluoroethylene/perfluoro(alkyl vinyl ether)/hexafluoropropylene copolymer (EPA), polyhexafluoropropylene, ethylene/tetrafluoroethylene copolymer (ETFE), poly trifluoroethylene, polyvinylidene fluoride (PVDF), polyvinyl fluoride (PVF), polychlorotrifluoroethylene (PCTFE), ethylene/chlorotrifluoroethylene copolymer (ECTFE), or any combination thereof.

18. The method of claim 11, wherein the exposing comprises heating at least a portion of the substrate at or to a temperature of 200° C. to 600° C.

19. The method of claim 11, wherein the exposing comprises exposing the substrate to the fluorine-containing vapor for a duration of 1 millisecond to 15 hours.

20. The method of claim 11, wherein the exposing comprises exposing the substrate to the fluorine-containing vapor at about atmospheric pressure.

\* \* \* \* \*